(12) United States Patent
Murakami

(10) Patent No.: US 7,716,825 B2
(45) Date of Patent: May 18, 2010

(54) METHOD FOR MANUFACTURING PRINTED WIRING BOARD

(75) Inventor: Keiichi Murakami, Komaki (JP)

(73) Assignee: Noda Screen Co., Ltd., Aichi (JP)

( * ) Notice: Subject to any disclaimer, the term of this patent is extended or adjusted under 35 U.S.C. 154(b) by 633 days.

(21) Appl. No.: 10/538,505

(22) PCT Filed: Dec. 9, 2002

(86) PCT No.: PCT/JP02/12842

§ 371 (c)(1),
(2), (4) Date: Jun. 9, 2005

(87) PCT Pub. No.: WO2004/054336

PCT Pub. Date: Jun. 24, 2004

(65) Prior Publication Data

US 2006/0115582 A1 Jun. 1, 2006

(51) Int. Cl.
*H05K 3/02* (2006.01)
*H05K 3/10* (2006.01)

(52) U.S. Cl. .............. 29/846; 29/830; 29/831; 29/847; 156/285; 156/295; 174/255; 174/258

(58) Field of Classification Search ........... 29/846, 29/830, 831, 847; 156/285, 295; 174/255, 174/258; 257/678, 688
See application file for complete search history.

(56) References Cited

U.S. PATENT DOCUMENTS 6,010,768 A * 1/2000 Yasue et al. ............... 428/209

6,268,648 B1 * 7/2001 Fukutomi et al. ........... 257/678

FOREIGN PATENT DOCUMENTS

| JP | 3-34494 | 2/1991 |
|---|---|---|
| JP | 8-32213 | 2/1996 |
| JP | 2000-332387 | * 11/2000 |
| JP | 2001-203453 | 7/2001 |

OTHER PUBLICATIONS

International Search Report issued Mar. 18, 2003 in the International (PCT) Application No. PCT/JP02/12842.

* cited by examiner

*Primary Examiner*—Thiem Phan
(74) *Attorney, Agent, or Firm*—Wenderoth, Lind & Ponack, L.L.P.

(57) ABSTRACT

A method for manufacturing a printed wiring board, including forming a thermosetting resin layer on the printed wiring board; heating and curing the resin layer; and then polishing the cured resin layer, thereby exposing the circuit patterns. Additionally, the step of heating and curing includes maintaining the resin layer at a non-curable temperature in a state where the resin layer is pressed via the smoothing plate in a reduced pressure chamber; heating the resin layer in the pressed state to a curing temperature; introducing outside air into the reduced pressure chamber with the pressed state and the curing temperature maintained; reducing the pressure applied to the smoothing plate with the curing temperature maintained; and cooling the resin layer.

11 Claims, 5 Drawing Sheets

METHOD FOR MANUFACTURING PRINTED WIRING BOARD

This application is the U.S. National Phase Application under 35 U.S.C. 371 of International Application No. PCT/JP02/12842, filed on Dec. 9, 2002.

TECHNICAL FIELD

The present invention relates to a method for manufacturing a printed wiring board.

BACKGROUND ART

In the case of manufacturing a multilayer printed wiring board by e.g. a build-up method, it is necessary to flatten the surface of a lower layer substrate in order to increase the wiring density. However, the circuit pattern of a printed board, which is manufactured via a subtractive method of removing unnecessary parts of copper foil through etching, is generally formed into an uneven state in which the circuit pattern is raised from the surface of the base material.

Thus, a method has been proposed in order to flatten the printed board, of which the surface is formed in such an uneven form, in which a thermosetting resin is filled into the spaces between the circuit patterns and cured by heating. The surface of the resin is then polished.

The above described method for filling the spaces between circuit patterns with a resin includes for example, a method for applying a resin via screen printing and a method for laminating a semi-cured resin sheet. However, the method of applying a resin via screen printing has a problem in that air is inevitably involved with the resin during the printing. The involved air results in minute air bubbles, causing voids to be produced in the resin layer. The method of laminating a resin sheet also has a problem that air enters between the resin sheet and the substrate and results in air bubbles. This also causes voids to be produced in the resin layer. Such voids are not preferred because they tend to burst during the heating stage of a subsequent process, or the voids may deteriorate the electrical characteristics of the substrate.

In recent years, there has been proposed a technique for pressing the resin layer in a reduced pressure atmosphere as a method for removing the air bubbles in the resin, which cause the voids. The air bubbles in the resin are pressed in a reduced pressure atmosphere so that the air bubbles are moved to the surface of the resin layer and then released to the outside. In this case, a resin with a lower viscosity facilitates the movement of the air bubbles in the resin, so as to allow the air bubbles to be more effectively removed. On the other hand, however, there is a problem that a resin with a lowered viscosity can flow out from the spaces between the circuit patterns when the resin layer is pressed.

The present invention has been made in view of the above described circumstances. An object of the present invention is to provide a method for manufacturing a printed wiring board that makes it possible to sufficiently remove air bubbles in the resin and to provide a generally excellent curing state of the resin.

DISCLOSURE OF THE INVENTION

According to the present invention, in order to solve the above described problem there is a method provided for manufacturing a printed wiring board, including: forming a thermosetting resin layer so as to fill the spaces between the circuit patterns on a printed wiring board with the circuit patterns formed thereon; heating and curing the resin layer in a reduced pressure chamber while a smoothing plate is being pressed against the resin layer; and then polishing the cured resin layer covering the circuit patterns, thereby exposing the circuit patterns. The step of heating and curing the resin layer in the reduced pressure chamber comprises the following successively performed steps: holding the resin layer in a pressed state via the smoothing plate in the reduced pressure chamber at a non-curing temperature so as to prevent the resin from curing (step 1); heating the resin layer in the pressed state to a curing temperature in order to cure the resin layer (step 2); introducing outside air into the reduced pressure chamber with the pressed state and the curing temperature maintained (step 3); reducing the pressure applied to the smoothing plate with the curing temperature maintained (step 4); and cooling the resin layer (step 5).

In step 1 according to the present invention, the applied pressure may be raised stepwise. The resin layer may also be applied (adhered) to the substrate by filling the spaces between the patterns with a liquid resin, or by superposing a semi-cured resin sheet onto the printed wiring board, and then superposing a metallic foil onto the resin layer with a roughened surface facing the resin layer. In this case, the metallic foil may be formed from a metal of a different type than the circuit patterns.

According to the present invention, in the step of heating and curing the resin layer formed on the substrate in the reduced pressure chamber (in which the pressure is reduced) while the resin layer is pressed by the smoothing plate, the resin layer is first held at a non-curing temperature to prevent the resin layer from curing, with the resin layer pressed via the smoothing plate in the reduced pressure chamber (step 1). For the non-curing temperature in this case, it is preferred to take a range of temperatures to prevent the resin from flowing out of the spaces between the circuit patterns due to an excessive decrease in the viscosity of the resin. For example, a temperature from about 100° C. to 140° C. is preferred in the case of an epoxy resin. Also, the time during which the non-curing temperature is maintained is preferably chosen such that a difference between the temperature near the surface of the resin and the internal temperature of the resin essentially causes no problem. In the case where a thermosetting resin layer is formed on the printed wiring board so as to fill the spaces between the circuit patterns, even if the resin layer is initially raised above the wiring pattern part, the resin layer is softened and pressed via the smoothing plate so as to be compressed in step 1. As a result, the resin layer as a whole thinly spreads into the spaces between the smoothing plate and the printed wiring board. Further, even if air bubbles are included in the resin layer, since the resin layer is pressed in a reduced pressure chamber in which the pressure is reduced, the air bubbles in the resin can be removed. Since the resin is suitably softened at this time, the air bubbles can also easily move out of the resin.

When the resin layer is flattened and the air bubbles in the resin are sufficiently removed in this way, the resin layer is then heated to a curing temperature for curing the resin layer, with the pressed state maintained (step 2). Thereby, the resin layer is cured in a state without the air bubbles included in the resin layer. Further, since the resin layer is in a condition of being pressed by the smoothing plate, even when contraction occurs due to curing the surface of the resin layer, the resin layer can be kept in a flat state.

Next, outside air is introduced into the reduced pressure chamber while the pressing state and the curing temperature are maintained (step 3). As a result, the hardness of the surface of the resin layer is raised, preventing the excessive outflow of resin, since the introduction of the outside air cools the surface of the resin layer.

Next, the pressure applied to the smoothing plate is reduced while the curing temperature of the resin is maintained (step 4). This step further prevents the excessive outflow of the resin.

The heating is then stopped and the resin layer is cooled (step 5).

By performing the above described steps in order, it is possible to obtain a flat substrate in which only a very thin resin layer remains on the circuit patterns. Additionally, a flat substrate is obtained in which the spaces between the circuit patterns are filled with a resin layer containing hardly any air bubbles. Then, by polishing the substrate so as to not damage the circuit pattern, the extremely thin resin layer can be easily removed, obtaining a smooth substrate with exposed circuit patterns.

When the smoothing plate is pressed against a resin layer located on the substrate, a metallic foil with a roughened surface facing the resin layer, which metallic foil is interposed between the smoothing plate and the resin layer, facilitates the spreading of the resin. The metallic foil also forms the surface of the resin layer in a fine uneven state in accordance with the roughened surface of the metallic foil. As a result, the residual resin layer can be more easily polished.

Further, in the case where the metallic foil interposed between the smoothing plate and the resin layer is formed of a different type of metal from the circuit patterns, it is possible to remove the metallic foil by selective etching or dissolving only the metallic foil without affecting the metal of the circuit patterns.

BEST MODE FOR CARRYING OUT THE INVENTION

Figure 1:
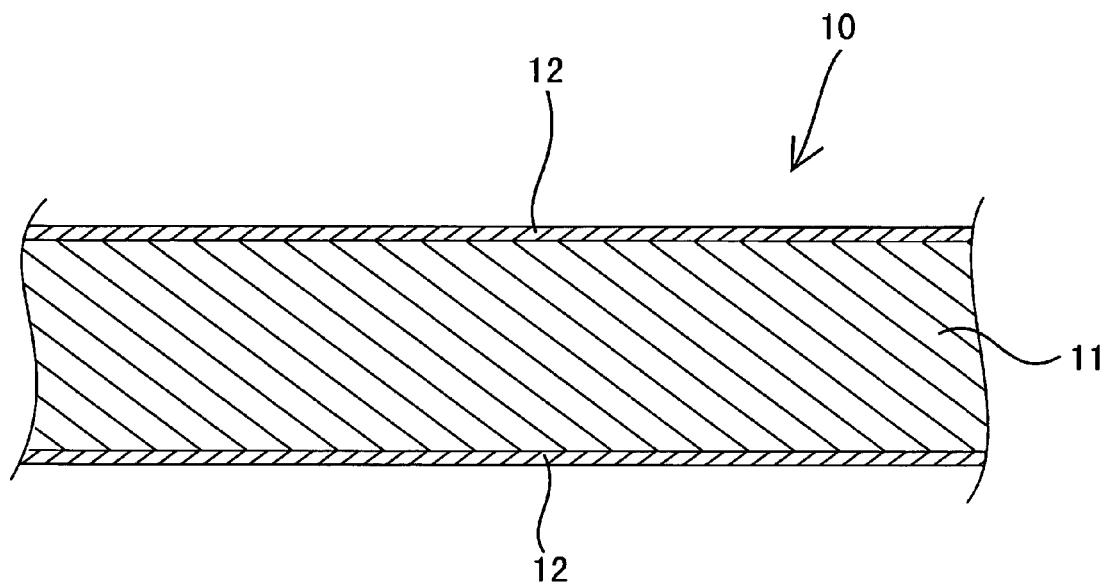
FIG. 1 is a sectional view of a copper clad laminated board.
Figure 2:
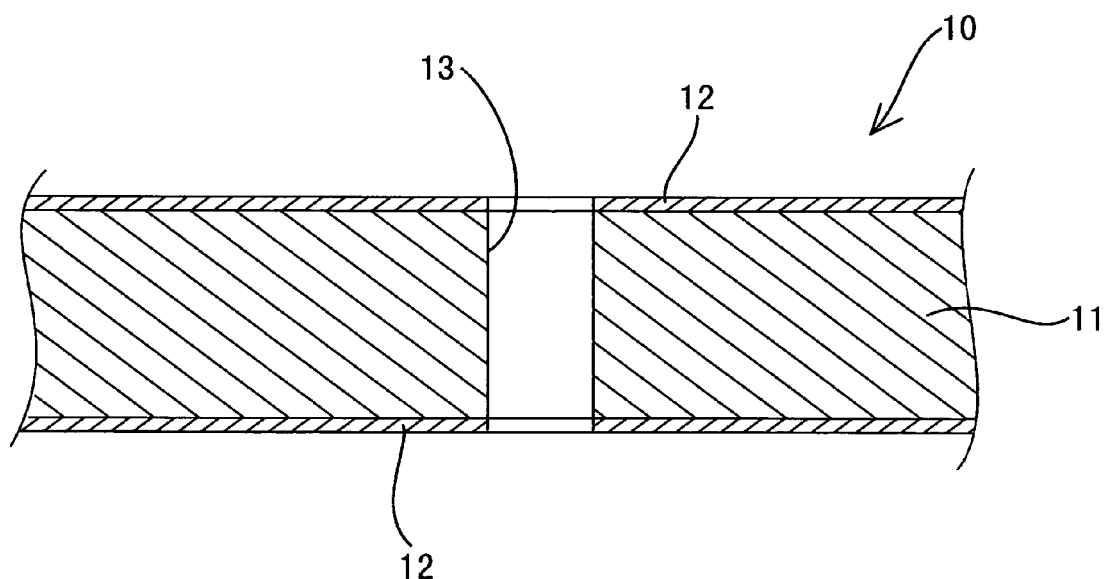
FIG. 2 is a sectional view of the wiring board in which through holes are formed.
Figure 3:
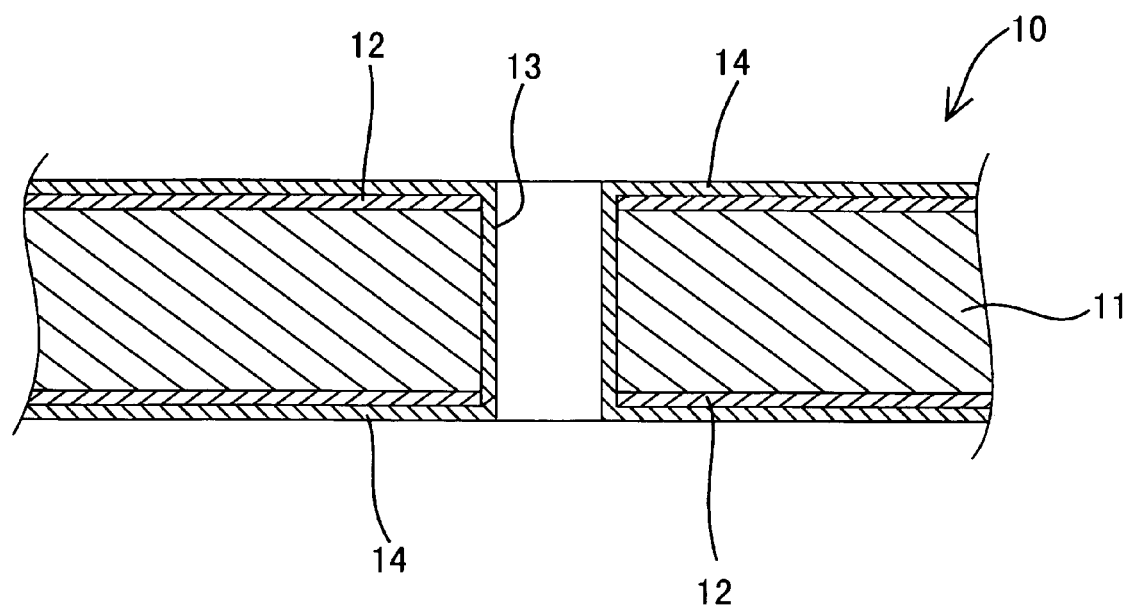
FIG. 3 is a sectional view of the wiring board on which plating layers are formed.
Figure 4:
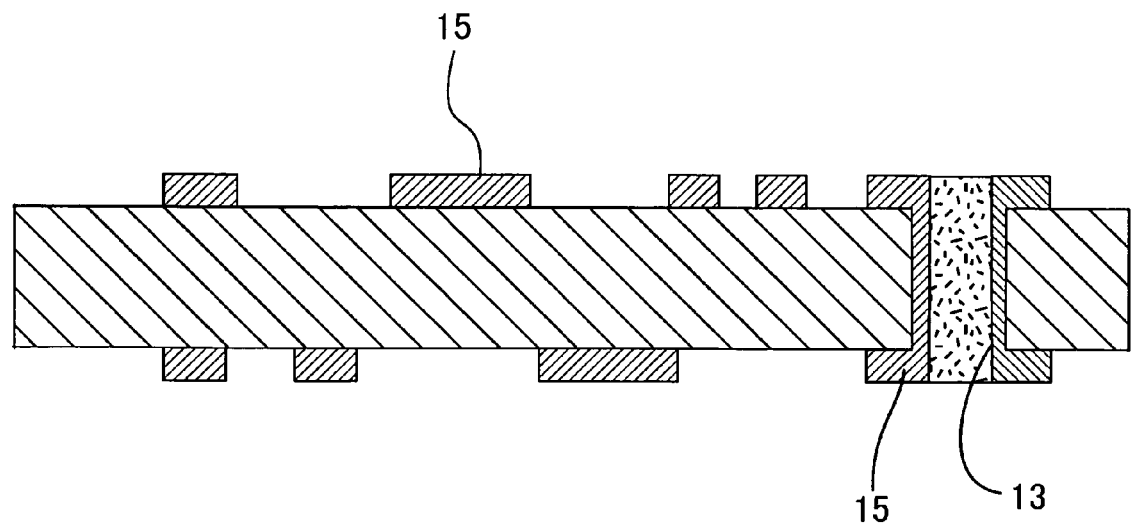
FIG. 4 is a sectional view of the wiring board on which circuit patterns are formed.

In the present embodiment, as shown in FIG. 1, a copper clad laminated board 10 with copper foils 12 adhered to both sides of a glass epoxy substrate 11 having a thickness of 100 to 3,000 μm is used as a base material. Boring through the copper clad laminated board 10 at required positions forms the through holes 13 (see FIG. 2). Chemical plating and electrolytic plating are performed in order to form the copper plated layers 14 upon the entire surface area, including the inner peripheral face of the through holes 13, so as to make the thickness of the conductor layer on the surface of the substrate approach approximately 20 μm (see FIG. 3). A resin then fills in the through holes 13 and is cured. Polishing flattens the resin projected to the surface of the substrate. Circuit patterns 15 are then formed on the smoothed substrate by a known photo-etching method (see FIG. 4).

Figure 5:
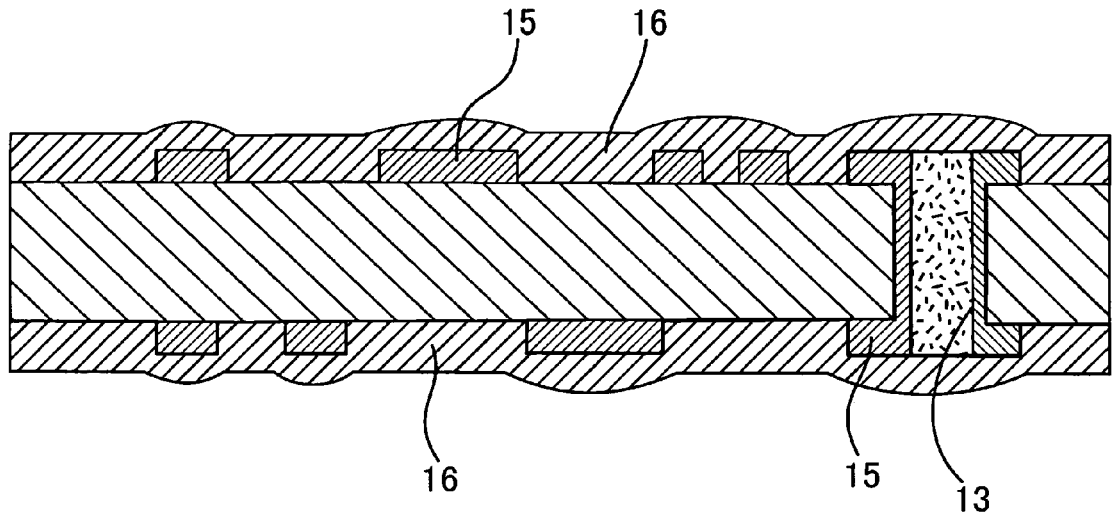
FIG. 5 is a sectional view of a wiring board of a first embodiment according to the present invention, on which resin layers are formed.
Figure 6:
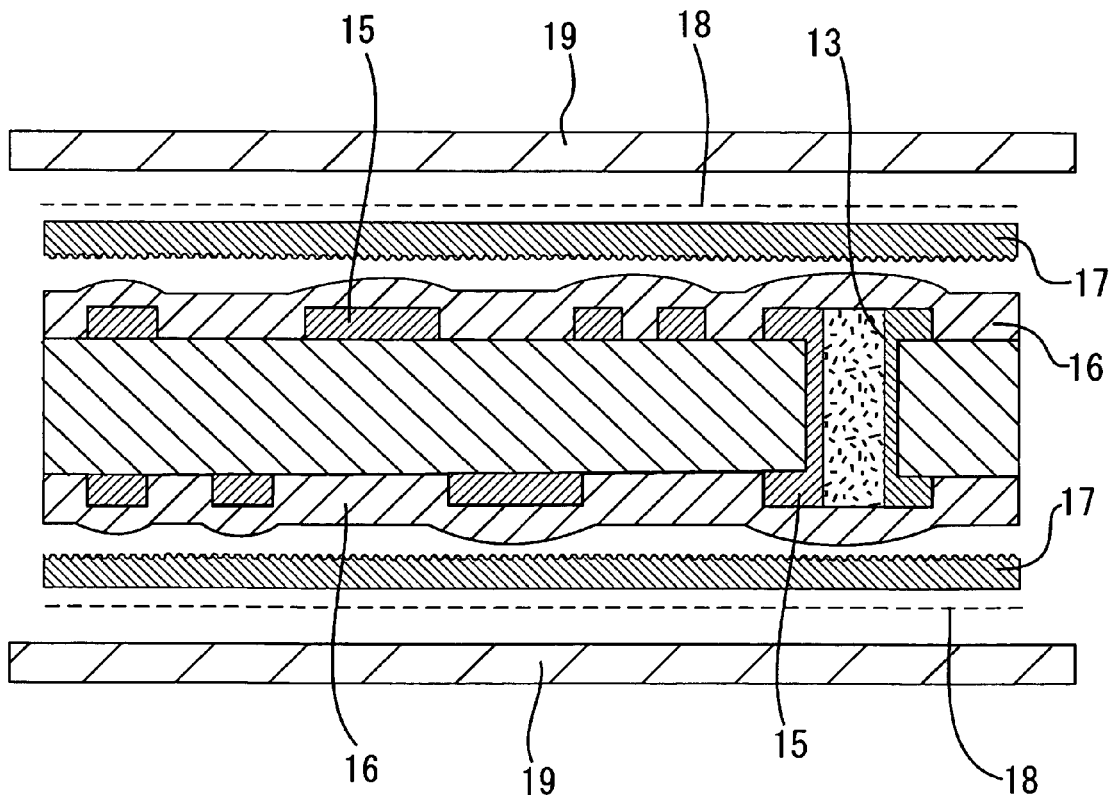
FIG. 6 is a sectional view of the wiring board showing a layout at the time of the pressure reducing press.

As shown in FIG. 5, a liquid thermosetting epoxy resin is then applied to the wiring board by e.g. screen printing, etc. so as to have a thickness of 30 to 80 μm. The circuit patterns 15 are thoroughly covered by the resin layers 16. The resin layers 16 are then heated at 140° C. so as to be in a semi-cured state. At this point, minute air bubbles may be included in the resin layers 16. The surface of the resin layers 16 is in a gradually undulating state in which the portions over the circuit patterns 15 are raised. Next, as shown in FIG. 6, nickel foils 17 with a thickness of 18 μm, one face of which is roughened by a needle shaped plating, are put on the resin layers 16 such that the roughened surfaces face the resin layers 16.

Figure 7:
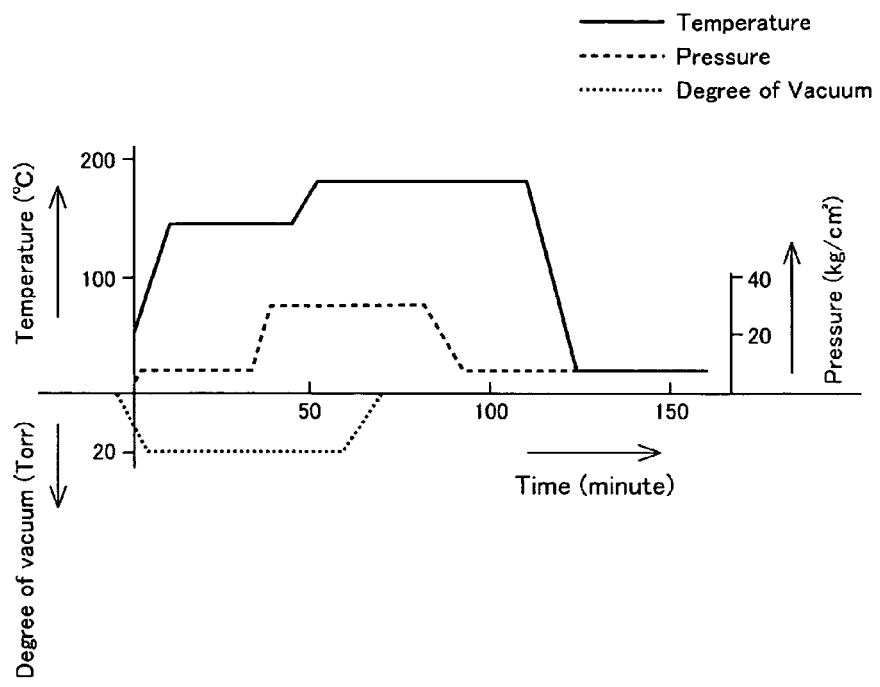
FIG. 7 is a graph showing a relationship between temperature, pressure, and degree of vacuum, when the resin is cured.

As described above, thirteen laminated bodies in which the resin layers 16 and the nickel foils 17 are superposed on a wiring board are respectively prepared. Each laminated body is superposed through the intermediary of a Teflon sheet 18 as a mold release film. In addition, smooth stainless steel plates 19 with a thickness of about 1 mm are superposed from the outside, via the respective intermediary of the Teflon sheets 18. FIG. 6 shows a schematic representation in which the set of a laminated body is interposed between the stainless plates 19. The following steps are then successively performed on the laminated body (see FIG. 7).

Initially, while the resin layers 16 are heated at 140° C. for 30 minutes in a reduced pressure chamber (not shown) of which the pressure is reduced, the pressure applied to the stainless plates 19 is increased in stages to be finally set at a pressure of 30 kg/cm$^2$ (step 1). The surface of the resin-layers 16, which is in a gradually undulating state, is then compressed to the point of being flattened by the smooth stainless plates 19, while the resin layers 16 as a whole spreads thinly over the substrate. The air bubbles in the resin layers 16 rise up to the vicinity of the surface of the resin layers 16, so as to be removed from the inside of the resin.

In a state where the pressure applied to the stainless plates 19 is maintained, the resin layers 16 are next heated at 180° C. so as to be finally cured (step 2). The resin layers 16 are cured without containing the air bubbles. After the resin layers 16 reach 180° C. and the final curing is started, outside air is introduced into the reduced pressure chamber while maintaining the above described pressing state and temperature (step 3). The inflow of outside air lowers the temperature of the exposed surfaces of the resin layers 16 and increases the hardness of these surfaces. As a result, the resin is prevented from excessively flowing out of the spaces between the circuit patterns.

When the resin layers 16 as a whole are almost cured, the pressure applied to the stainless plates 19 is reduced (step 4). This makes it possible to prevent the resin layers from being excessively compressed and the resin from further flowing out. After the resin layers 16 are sufficiently cured, the laminated bodies as a whole are cooled (step 5).

Figure 8:
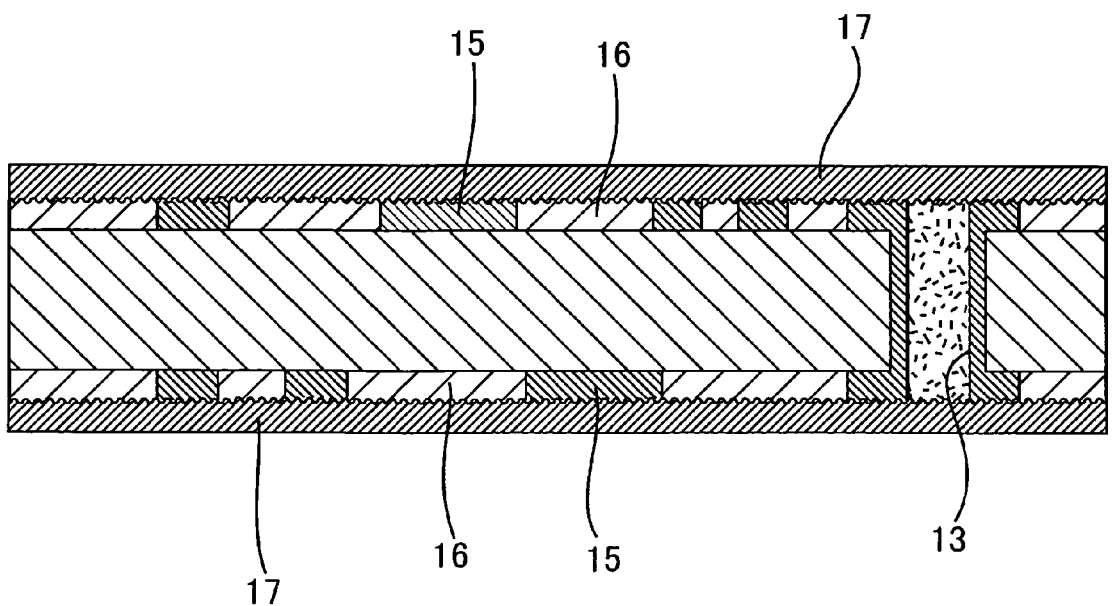
FIG. 8 is a sectional view of the wiring board after the resin is cured.
Figure 9:
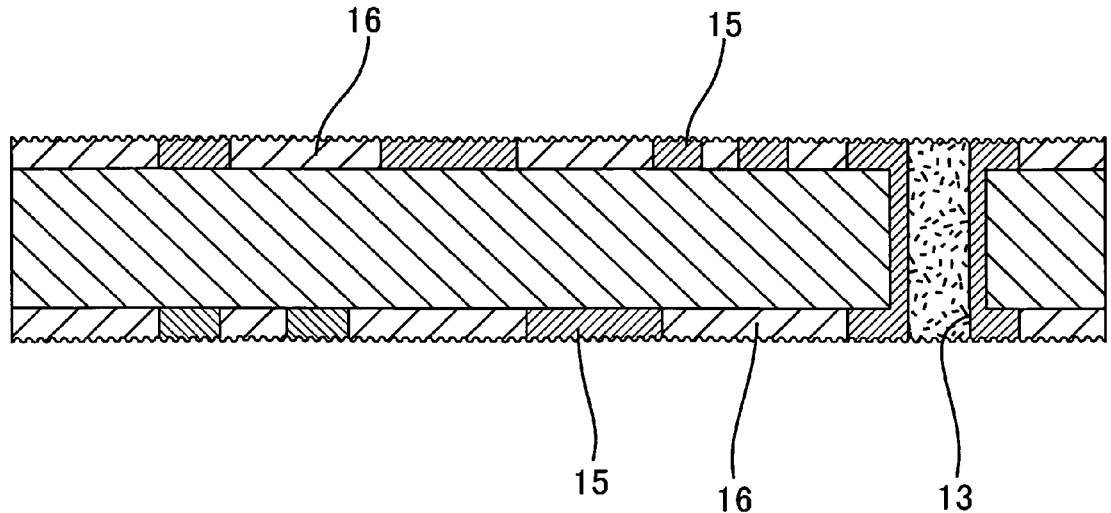
FIG. 9 is a sectional view of the wiring board after a metallic foil is removed.
Figure 10:
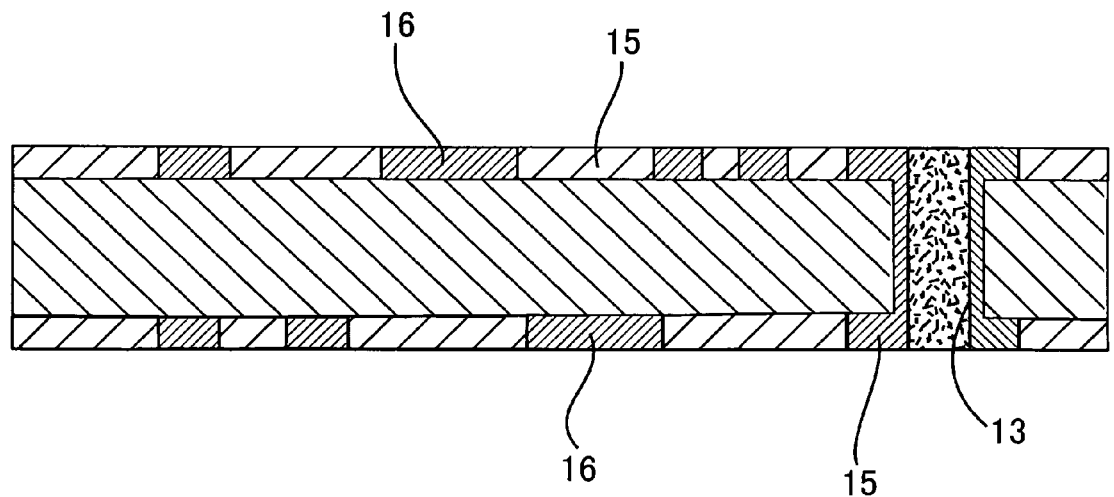
FIG. 10 is a sectional view of the wiring board after polishing.

The nickel foils 17 adhered to the surface of the resin layers 16 are removed via an etching solution used exclusively for nickel (see FIGS. 8 and 9). As a result, the resin layers remaining on the copper circuit patterns 15 become 5 μm or less, and their surface is in a roughened state. Then, the primary smooth surface polishing for removing the resin layers 16 from the circuit patterns 15 via ceramic buff polishing and the secondary finish polishing for making the average roughness accuracy within the surface equal to or less than 3 µm by means of a surface grinding machine are finally performed in order to flatten the substrate (see FIG. 10). In the case of the surface polishing, the polishing is easily performed since the resin layers 16 remaining on the circuit patterns 15 have an extremely thin thickness of 5 µm, and the surfaces of the resin layers are roughened.

In this way, according to the manufacturing method of the printed wiring board of the present embodiment, in the step of heating and curing the resin layers in the reduced pressure chamber, by successively performing the above described steps from step 1 to step 5 a generally excellent curing condition of the resin can be obtained without air bubbles contained in the resin.

The present invention is not limited to the embodiments described above with reference to the drawings, the following embodiments are also included within the scope of the present invention. Further various variations other than the following embodiments are also possible within the scope and spirit of the invention.

(1) In the above described embodiment, the resin layers are formed by having a liquid resin adhere to the substrate via screen printing. However, the embodiment is not limited to this case. A coating method and a curtain coating method may also be used. The substrate may also be laminated with semi-cured resin sheets. In this case, in the step of heating and curing the resin layers in the reduced pressure chamber, a generally excellent curing condition of the resin without the air bubbles included in the resin can also be obtained by successively performing the above described steps from step 1 to step 5.

(2) In the above described embodiment, the circuit patterns are formed by the subtractive method. However, the circuit patterns may also be formed by an additive method.

(3) In the above described embodiment, a thermosetting epoxy resin is used as the material of the resin layers. However, the embodiment is not limited to this case. A thermosetting resin, such as an urea resin, a melamine resin, a phenol resin, an acrylic resin, and an unsaturated polyester resin, may also be used.

(4) In the above described embodiment, nickel is used as the metallic foil material. However, the embodiment is not limited to this case. Other metals such as copper may also be used.

INDUSTRIAL APPLICABILITY

As described above, according to the present invention, it is possible to manufacture a printed wiring board in which the air bubbles in the resin can be sufficiently removed, and in which a generally excellent curing state of the resin can be obtained.

The invention claimed is:

1. A method for manufacturing a printed wiring board which includes forming a thermosetting resin layer so as to fill spaces between circuit patterns formed on a surface of the printed wiring board, heating and curing the resin layer, and then polishing the cured resin layer covering the circuit patterns, thereby exposing the circuit patterns, wherein the step of heating and curing the resin layer comprises:
   maintaining the resin layer at a non-curable temperature range between 100° C.-140° C. where the resin layer is pressed via a smoothing plate in a reduced pressure environment;
   heating the resin layer in the pressed state to a curing temperature at which the resin layer is cured;
   introducing outside air into the reduced pressure environment while maintaining the pressed state and the curing temperature;
   reducing the pressure applied to the smoothing plate while maintaining the curing temperature; and
   cooling the resin layer,
   wherein a metallic foil with a roughened surface facing the resin layer is superposed on the resin layer.

2. The method for manufacturing a printed wiring board according to claim 1, wherein an applied pressure to the smoothing plate is increased in predetermined stages of pressure change.

3. The method for manufacturing a printed wiring board according to claim 2, wherein the resin layer is formed by adhering a liquid resin to the printed wiring board so as to fill spaces between the circuit patterns.

4. The method for manufacturing a printed wiring board according to claim 3, wherein the metallic foil is formed with a different type of metal than the circuit patterns.

5. The method for manufacturing a printed wiring board according to claim 2, wherein the resin layer is formed by superposing a semi-cured resin sheet on the printed wiring board.

6. The method for manufacturing a printed wiring board according to claim 5, wherein the metallic foil is formed with a different type of metal than the circuit patterns.

7. The method for manufacturing a printed wiring board according to claim 1, wherein the resin layer is formed by superposing a semi-cured resin sheet on the printed wiring board.

8. The method for manufacturing a printed wiring board according to claim 7, wherein the metallic foil is formed with a different type of metal than the circuit patterns.

9. The method for manufacturing a printed wiring board according to claim 1 wherein the reduced pressure environment is provided by a reduced pressure chamber.

10. The method for manufacturing a printed wiring board according to claim 1, wherein the resin layer is formed by adhering a liquid resin to the printed wiring board so as to fill spaces between the circuit patterns.

11. The method for manufacturing a printed wiring board according to claim 10, wherein the metallic foil is formed with a different type of metal than the circuit patterns.

* * * * *